United States Patent [19]

Butler et al.

[11] 4,065,766
[45] Dec. 27, 1977

[54] ANALOG-TO-DIGITAL CONVERTER

[75] Inventors: Walter J. Butler, Scotia; Charles W. Eichelberger, Schenectady, both of N.Y.

[73] Assignee: General Electric Company, Schenectady, N.Y.

[21] Appl. No.: 668,329

[22] Filed: Mar. 18, 1976

[51] Int. Cl.² .......................................... H03K 13/20
[52] U.S. Cl. ...................... 340/347 AD; 340/347 NT
[58] Field of Search .... 340/347 M, 347 AD, 347 NT, 340/347 CC; 357/24

[56] References Cited

U.S. PATENT DOCUMENTS

| | | | |
|---|---|---|---|
| 3,626,408 | 12/1971 | Carbrey | 340/347 AD |
| 3,651,518 | 3/1972 | Carbrey | 340/347 AD |
| 3,653,030 | 3/1972 | Carbrey | 340/347 AD |
| 3,733,600 | 5/1973 | Hellwarth | 340/347 NT |
| 3,828,347 | 8/1974 | Sacks | 340/347 NT |
| 3,836,906 | 9/1974 | Ando | 340/347 M |
| 3,903,543 | 9/1975 | Smith | 340/347 AD |
| 3,906,488 | 9/1975 | Suarez | 340/347 AD |
| 3,930,255 | 12/1975 | Means | 340/347 AD |

*Primary Examiner*—Charles D. Miller
*Attorney, Agent, or Firm*—Stephen B. Salai; Joseph T. Cohen; Jerome C. Squillaro

[57] ABSTRACT

A charge transfer analog-to-digital converter is provided wherein a plurality of charge packets is transferred into and out of a charge storage location which includes both linear and nonlinear capacitive components. At the initiation of an analog-to-digital measurement cycle the level of charge in the nonlinear portion of the charge storage location is established at an initial value by comparison with a reference voltage. During the measurement cycle the level of charge in the linear and nonlinear portions of the capacitive charge storage location vary from the initial values thereof as charge is transferred into and out of the charge storage location according to the particular method of analog-to-digital conversion. At the end of the measurement cycle, the level of charge in the nonlinear portion is again established at the initial value thereof so that the net change in charge stored in the nonlinear portion of the charge storage location is zero from the beginning to the end of the measurement cycle.

17 Claims, 6 Drawing Figures

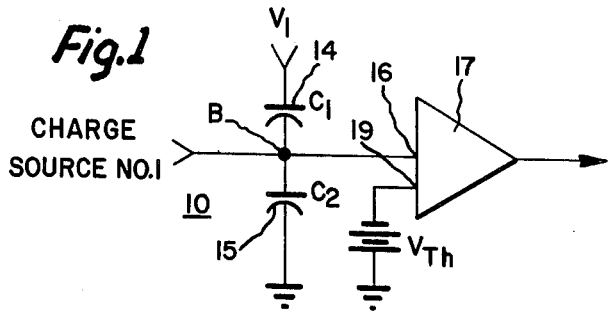
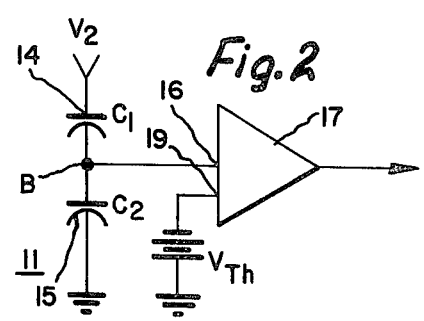
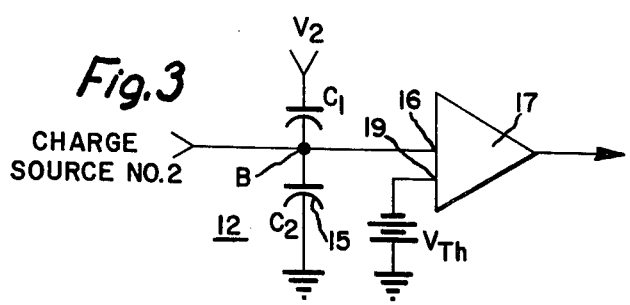
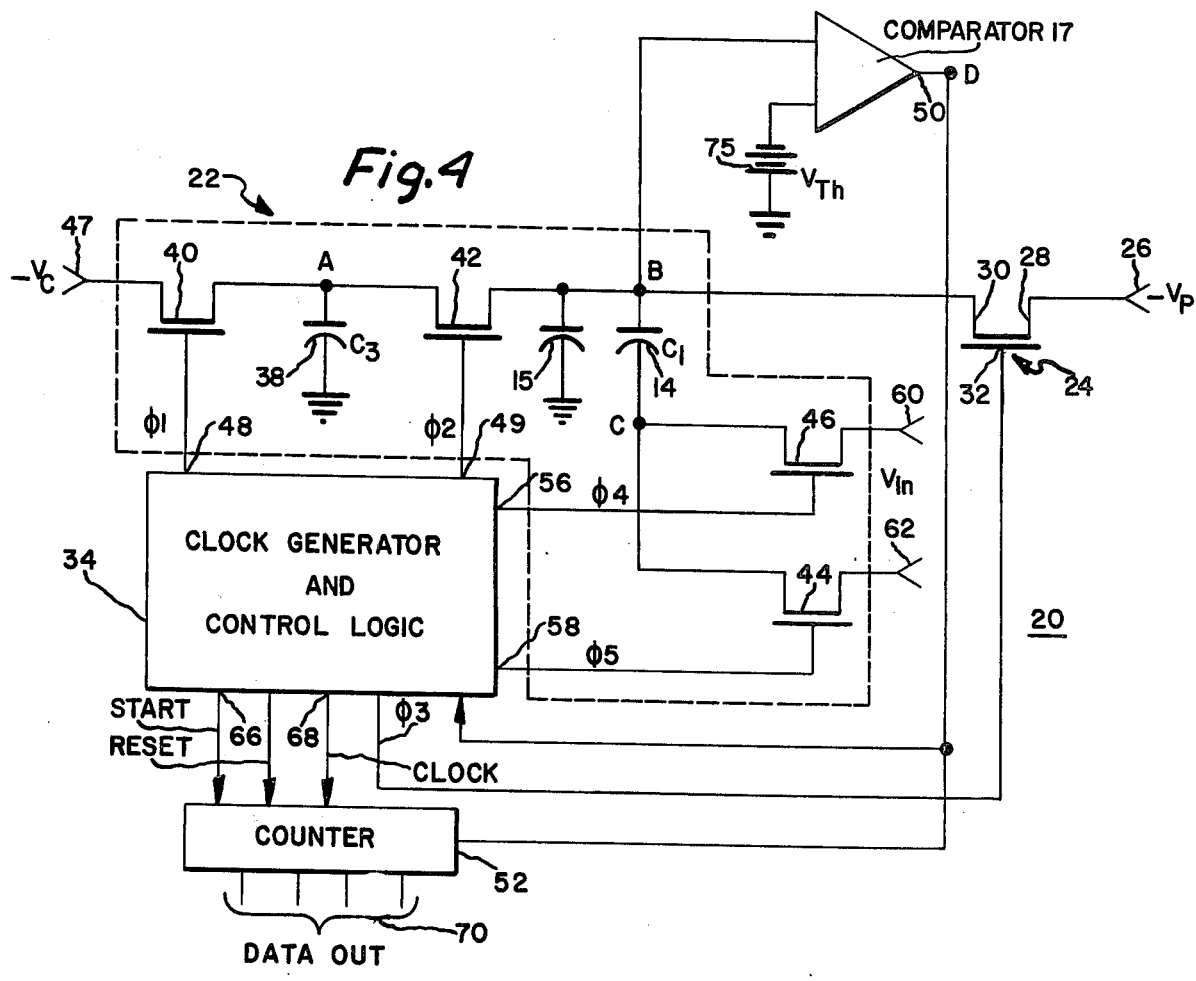

ANALOG-TO-DIGITAL CONVERTER

This invention relates, in general, to analog-to-digital converters and more specifically to analog-to-digital converters wherein the conversion process is accomplished through the use of charge transfer techniques.

Charge transfer analog-to-digital converters of the type described, for example, in United States patent applications Ser. No. 628,401 of Eichelberger and Ser. No. 628,542 of Butler et al, both of common assignee herewith, provide analog-to-digital converters suitable to be implemented in monolithic integrated circuit form. The aforementioned patent applications describe analog-to-digital converters providing numerous advantages over the prior art. The instant application is directed to an improvement in charge transfer analog-to-digital converters wherein nonlinearities due to parasitic semiconductor depletion capacitance are eliminated. While the instant invention is particularly applicable to charge transfer analog-to-digital converters of the types described in the aforementioned patent applications, it may equally well be employed in other types of charge transfer A/D converters known to those skilled in the art.

It is an object of this invention to provide a method and apparatus for the conversion of an analog signal to the digital equivalent thereof through the use of charge transfer into and out of certain charge storage locations.

It is another object of this invention to provide such an analog-to-digital converter which substantially eliminates the effects of nonlinear depletion capacitance componets in the charge storage location.

It is yet another object of this invention to provide a charge transfer analog-to-digital converter providing differential input signal voltage capabilities in a form suitable for monolithic integration on a single semiconductor chip.

Briefly stated and in accordance with one aspect of this invention a charge transfer analog-to-digital converter is provided wherein a plurality of charge packets is transferred into and out of a charge storage location which includes both linear and nonlinear capacitance components. At the initiation of an analog-to-digital measurement cycle the level of charge in the nonlinear portion of the charge storage location is established at an initial value by comparison with a reference voltage. During the measurement cycle the level of charge in the linear and nonlinear portions of the capacitive charge storage location vary from the initial values thereof as charge is transferred into and out of the charge storage location according to the particular method of analog-to-digital conversion. At the end of the measurement cycle, the level of charge in the nonlinear portion is again established at the initial value thereof so that the net change in charge stored in the nonlinear portion of the charge storage location is zero from the beginning to the end of the measurement cycle.

In a presently preferred embodiment of this invention, a metal-oxide-semiconductor capacitive charge storage location is utilized. This type of charge storage location is formed by the coaction between a metal electrode insulatingly overlying a semiconductor substrate and a region, of relatively high impurity concentration, extending from the surface of said substrate into the bulk of the device. The metallized electrode and the region of relatively high impurity concentration form the two electrodes of a capacitor. The electrode is separated from the semiconductor substrate by a layer of insulating material therebetween. Further, connection is made between the electrode and further semiconductor region extending from the surface of the semiconductor substrate down into the bulk thereof, which further semiconductor region may, in accordance with a presently preferred embodiment of this invention, form an element of a semiconductor device, as for example, a transistor. Charge may, therefore, be stored in the charge storage capacitor formed as hereinabove described. It will be appreciated that a capacitive charge storage location formed in this manner has two capacitive components. In the region between the metal electrode and the surface of the semiconductor substrate, that is to say in the region comprising the insulating layer, electric fields having uniform gradients are formed. This is the linear portion of the capacitor. Also associated with a capacitor of this type are nonlinear capacitive components. These components may be considered to exist between the regions of high impurity concentration, which are advantageously of opposite conductivity type of the semiconductor substrate, and the substrate itself. The precise characteristics of the nonlinear portion of the capacitive charge storage location varies with the impurity concentration, the extent, if any, of depletion in the substrate and other considerations well known to those skilled in the art.

The effect of this nonlinear depletion capacitance which is effectively series connected with the aforementioned linear portion of the charge storage capacitance is to create a nonlinear relationship between the electrode voltage and the amount of charge stored thereunder. This invention eliminates the effects of this nonlinearity by maintaining the net change in charge stored in the nonlinear portion of the charge storage capacitor at zero throughout the measurement cycle.

The operation of this invention may be readily understood by visualizing the linear and nonlinear portions of the charge storage capacitance as series connected capacitors, the nonlinear depletion capacitance being considered to be connected between the surface of the semiconductor substrate underlying the electrode and the opposite surface of the semiconductor substrate which is conventionally grounded, or which may be considered to be at circuit ground. The linear capacitance may be considered to exist between the surface of the substrate and the electrode. By sensing the level of charge stored in the storage capacitance, as for example, through the use of a charge sensitive comparator, the amount of charge stored in the depletion capacitance may be readily determined and compared to a reference value. A measurement cycle in accordance with this invention begins and ends with the amount of charge stored in the depletion capacitance equal to a preselected reference level. It is to be understood that charge is transferred into and out of the depletion capacitance during the cycle but that the net change is zero. In accordance with this invention, the total charge transferred into or out of the charge storage location including both the linear and nonlinear capacitances thereof is proportional to the input analog voltage and since the net change in the nonlinear portion is zero, the total net change occurs in the linear capacitance portion of the charge storage location and provides the required linear characteristic.

In accordance with one aspect of this invention a precharge voltage is applied to the node connecting the linear and nonlinear capacitors, the nonlinear capacitor being connected as was hereinbefore described to ground and the linear capacitor being connected to a first input signal voltage. Charge is supplied to the node connecting the two capacitors until a preselected threshold level is reached. The linear capacitor terminal remote from the common node is then switched to a second input signal source which may be ground in a single-ended embodiment of this invention or a second of a pair of differential inputs in a differential embodiment of the invention. If the second voltage is different from the first voltage, the voltage at a common node will change from the preselected value. A plurality of substantially equal sized charge packets is then removed from the charge storage location and specifically from the common node thereof until the preselected voltage level is again reached. It will be appreciated that the net change in charge across the nonlinear capacitance during the cycle is zero and the net change in charge across the linear portion is directly proportional to the difference between the first and second input signal voltages, and further that since the only charge transferred from the charge storage capacitance was the plurality of substantially equal sized charge packets, that the number of charge packets in this plurality will be directly proportional to the difference in input voltages.

The features of the invention which are believed to be novel are pointed out with particularity in the appended claims. The invention itself, however, both as to its organization and method of operation together with further objects and advantages thereof may best be understood by reference to the following description taken in connection with the accompanying drawing in which:

FIGS. 1-3 are schematic diagrams which illustrate the isolation of linear and nonlinear components of charge storage capacitance in accordance with this invention.

FIG. 4 is a partial schematic, partial block diagram of an analog-to-digital converter in accordance with this invention.

Figure 5:
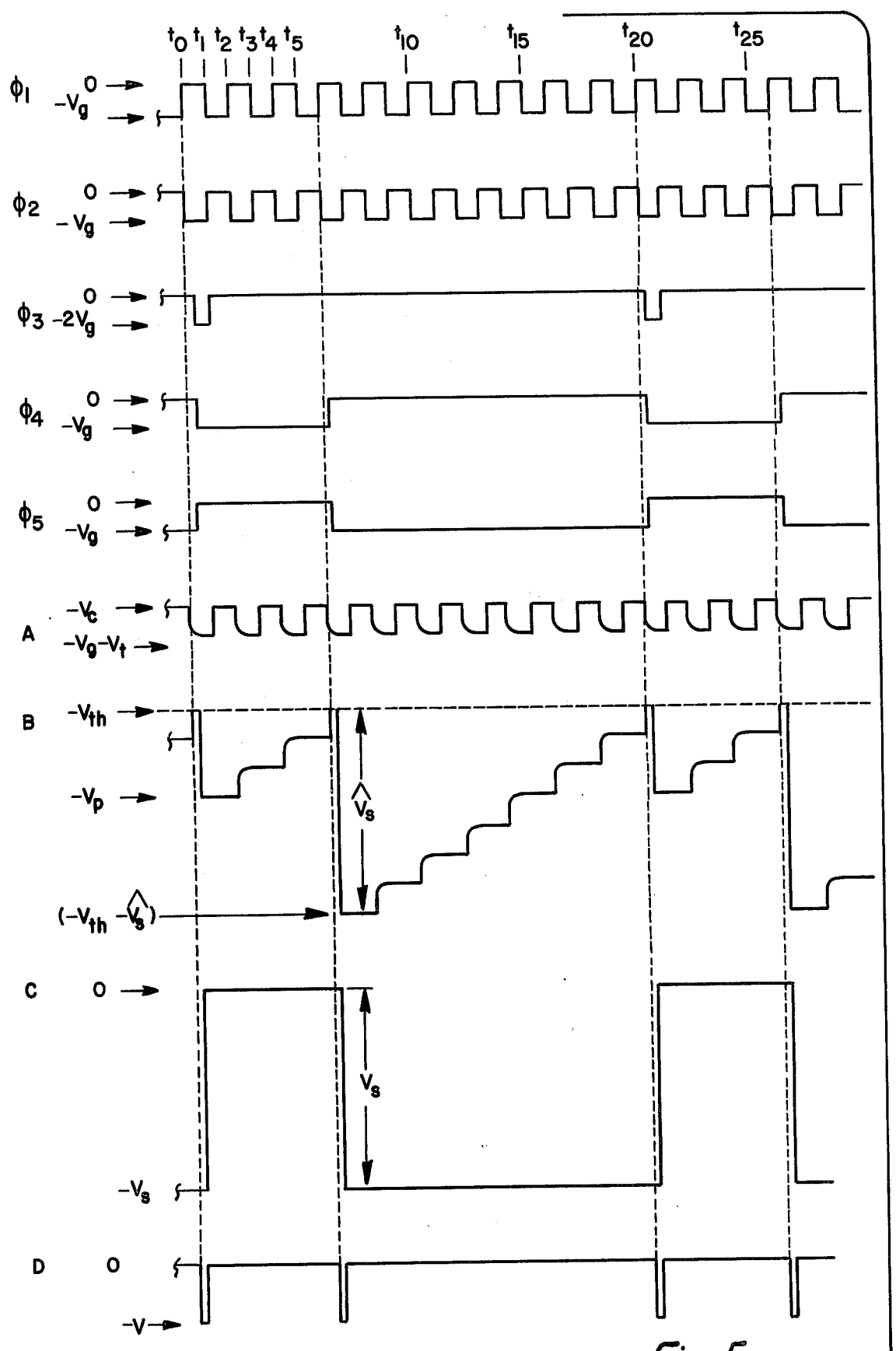
FIG. 5 is a graphical representation of a number of the voltages associated with the operation of the analog-to-digital converter of FIG. 4.

The elimination of the effect of nonlinear depletion capacitance in a charge transfer analog-to-digital converter in accordance with this invention may be readily understood by referring now to FIGS. 1-3. Each of circuits 10, 11 and 12 of FIGS. 1-3 include first and second capacitors 14 and 15 which are designated $C_1$ and $C_2$, respectively. Capacitors 14 and 15 have a common node B therebetween which is connected to input 16 of comparator 17. A second input 19 of comparator 17 is connected to a voltage $V_{Th}$ which may conveniently be the threshold voltage of the comparator. Node B is further selectively connected to charge sources as will be hereinbelow described. Capacitor $C_1$ is selectively connected to voltage sources $V_1$ or $V_2$ while capacitor $C_2$ is connected between node B and ground in all instances. Capacitors $C_1$ and $C_2$ represent the linear and nonlinear components of an MOS charge storage location respectively. It is to be understood, as was hereinabove discussed, that although capacitor $C_2$ which, in FIGS. 1-3 as well as FIG. 4, is shown having one end thereof connected to ground; that a literal ground is not intended, but rather a substrate ground or circuit ground is provided.

An analog-to-digital conversion cycle begins with the conditions illustrated at FIG. 1. A first input signal voltage $V_1$ is applied to capacitor 14. $V_1$ is the low input voltage, which may be either zero volts in the case of a single-ended input or the lower of two input voltages in the case of a differential input. A source of charge is connected to node B. This source of charge provides sufficient charge to increase the voltage at node B to the threshold voltage of comparator 17. The amount of charge required depends upon the values of $C_1$ and $C_2$, the value of $V_{Th}$ and the voltage applied to capacitor 14. Charge is supplied to node B until the threshold voltage of the comparator is reached at which point the charge stored in capacitor 15 may be expressed as $$Q_{C_2} = C_2 V_{Th}$$

wherein $Q_{C_2}$ is the amount of charge stored in capacitor 15, $C_2$ is the capacitance of capacitor 15 when the voltage at node B is $V_{Th}$, and $V_{Th}$ is the threshold voltage of comparator 17. The charge stored in capacitor 14 may be represented as:

$$Q_{C_1} = C_1 (V_1 - V_{Th})$$

wherein $Q_{C_1}$ is the charge stored in capacitor $C_1$, ($C_1$ is the capacitance of capacitor $C_1$), $V_1$ is the low input voltage and $V_{Th}$ is as hereinabove described.

These expressions take the form $$Q = CV$$

which relationship is well known to those skilled in the art.

FIG. 2 illustrates the intermediate condition of the circuit of FIGS. 1-3 during a conversion cycle. Voltage $V_1$ is removed from capacitor 14 and voltage $V_2$ is substituted therefore. Voltage $V_2$ is the higher of two differential signal voltages or is the signal voltage in a single ended embodiment of this invention. Charge source number 1 is removed from node B, and all other conditions remain the same. It will be appreciated that the voltage at node B will now vary from the voltage at node B during the conditions illustrated at FIG. 1. The exact voltage at node B will be determined by the nonlinear characteristics of capacitor 15. The voltage at node B may be expressed as $$Q_{V_x} = C_{(V_x)} V_x$$

wherein $Q_{V_x}$ is the amount of charge stored in capacitor 15, $C_{(V_x)}$ is the capacitance of capacitor 15 when the voltage appearing at node B is $V_x$, and $V_x$ is the voltage appearing at node B. It is emphasized that since these conditions occurred during a measurement cycle that the values described need not be determined in accordance with this invention, and they are illustrated here for the sole purpose of providing an understanding of the operation of this invention during a charge transfer conversion cycle.

FIG. 3 illustrates the final stage in an annalog-to-digital conversion in accordance with this invention. Capacitor $C_1$ remains connected to voltage source $V_2$ as hereinabover described. Node B is connected to a second charge source. Depending upon the sign of voltages $V_1$ and $V_2$ and the type of charge supplied by charge source number 1 as illustrated in FIG. 1, charge source number 2 may be a source of positive or negative charge as determined by the direction of the change in voltage at node B between the conditions of FIGS. 1 and 2. In a presently preferred embodiment of this invention, charge source number 2 is further characterized in that charge is supplied in substantially equal size packets of charge the size of said packets being selected in order to provide a sufficiently small change in voltage per charge packet to provide the desired resolution in the conversion process. While the addition of charge through the mechanism of metered charge packets provides a charge storage analog-to-digital converter having numerous advantages, it may be desirable to provide alternative methods of supplying charge to node B. For example, charge may readily be supplied by injection, by radiation impinging upon the charge storage location, by dark current or by any of a number of other mechanisms which generate charge in semiconductor devices. It will be understood therefore that as utilized in the description and the claims of this invention, charge transfer is intended to encompass any and all methods of supplying, introducing or transferring charge to a charge storage location. Charge is supplied to node B until the voltage thereat again reaches the threshold voltage of comparator 17. When the threshold voltage is reached, the amounts of charge stored in capacitors 14 and 15 may be expressed as $$Q_{C_1} = C_1(V_1 - V_{Th}) \text{ and } Q_{C_2} = C_2 V_{Th}.$$

It will be appreciated by reference to FIGS. 1-3 that the net change in charge during the course of the conversion cycle is equal to the net change in charge in capacitor $C_2$ plus the net change in charge in capacitor $C_1$. Since capacitor $C_2$ begins and ends with the same amount of charge stored therein viz. $C_2 V_{Th}$, no portion of the net change in charge is attributable thereto. Capacitor $C_1$ begins with a charge stored therein equal to $C_1(V_1 - V_{Th})$ and ends with a charge stored therein equal to $C_1(V_2 - V_{Th})$, the net change in charge being equal therefore to $C_1(V_2 - V_1)$. Since the net change in charge stored in capacitor $C_2$ from the beginning to the end of an analog-to-digital conversion cycle is zero, the nonlinear characteristics, if any, of $C_2$ do not affect the accuracy of the conversion process.

An analog-to-digital converter in accordance with this invention is illustrated in partial schematic, partial block diagram form at FIG. 4. FIG. 5 graphically represents some of the waveforms of FIG. 4 and is useful in understanding the operation of the circuit thereof. The charge transfer analog digital converter, generally designated at 20, of FIG. 4, includes a charge transfer portion 22 enclosed within the dotted line but which also may be considered to include transistor switch 24, and a control portion which includes the circuit outside the dotted line. Charge transfer portion 22 is illustrated in an exemplary structural embodiment at FIG. 6.

Terminals 26 and 47 are adapted to be connected to sources of voltage designated as $-V_P$ and $-V_C$, respectively. $-V_P$ is a source of precharge voltage which provides the function of charge source number 1 of FIG. 1. While it is illustrated in this embodiment of the invention as a negative voltage, it will be understood that the principles of this invention apply equally well to a device wherein positive voltages are used and the charge transferred is in all cases the opposite from that which will be hereinbelow described. Terminal 26 is connected to drain terminal 28 of transistor switch 24 which may conveniently be a MOS semiconductor switch or any other type of switch known to those skilled in the art which will provide the function of selectively connecting or isolating terminal 26 from node B. Source terminal 30 of switch 24 is connected to node B which corresponds to node B of FIGS. 1-3. When semiconductor switch 24 is activated to permit the flow of current therethrough, charge is supplied to node B until such time as switch 24 is deactivated by the application of an appropriate voltage to gate terminal 32 thereof. Switch 24 is selectively operated in this embodiment of the invention by connection to clock generator and control logic module 34 the output of which is represented as $\phi_3$ which waveform is illustrated at FIG. 5. Capacitors 14 and 15 of analog-to-digital converter 20 correspond to the like numbered capacitors of FIGS. 1-3. The presently preferred embodiment of this invention illustrated at FIG. 4 incorporates several modifications to the basic analog-to-digital conversion technique illustrated at FIGS. 1-3. It is emphasized that these modifications while providing improved operation and increased accuracy are not essential in order to obtain at least some of the advantages of this invention. Accordingly, those skilled in the art will appreciate that these and other modifications and changes in the invention may be made without departing from the true spirit and scope thereof. For example, while in FIGS. 1-3 node B was preset at the threshold voltage of comparator 17 by the transfer of charge thereto from charge source number 1, node B in the embodiment of FIG. 4 is preset to the threshold voltage in a two-step process. At the initiation of a measurement cycle, node B may be at an arbitrary voltage level. Transistor switch 24 is selectively operated in order to connect node B to source of precharge voltage $-V_P$. Precharge voltage $-V_P$ is selected to decrease the voltage at node B below the threshold voltage of comparator 17. After node B has been preconditioned to a voltage below the comparator threshold voltage switch 24 is opened and charge packets are supplied to node B from capacitor 38 in conjunction with transistor switches 40 and 42. During this initial conditioning process, transistor switch 44 is closed and switch 46 is opened, thus connecting node C to either ground or to the lower of two differential input signals. The operation of transistor switches 40 and 42 along with capacitor 38 to provide charge packets is described as follows. Input terminal 47 is permanently connected to a source of voltage $-V_C$. This source of voltage presents a continuous source of charge for charging capacitor 38. Clock generator and control logic module 34 provides outputs $\phi_1$ and $\phi_2$ from output terminals 48 and 49 thereof, respectively. Signals $\phi_1$ and $\phi_2$ are illustrated graphically at FIG. 5 and are complementary square wave signals which alternately open and close transistor switches 40 and 42. When transistor switch 40 is closed, transistor switch 42 is opened and vice versa. Assume now that transistor switch 40 is closed and transistor switch 42 is open, charge will flow from input terminal 47 to capacitor 38 until a voltage level is reached at node A which is equal to $-V_C$. Charging voltage $-V_C$ is preferably selected to fall between the gate voltage utilized to control transistor 40, less the threshold voltage of transistor 40, and zero volts. The magnitude of the voltage $-V_C$ along with the ratio of the capacitances of capacitors 38 and 14 determine the rate of conversion for an analog-to-digital converter for a given value of gate voltage in accordance with this invention along with the resolution of the conversion process. FIG. 5 illustrates graphically the voltage appearing at node A. It will be observed that during the time transistor 40 is conducting, that this voltage is equal to the voltage applied to terminal 47. At time $T_2$, control voltages $\phi 1$ and $\phi 2$ reverse, that is $\phi 1$ changes to turn transistor 40 off while $\phi 2$ changes to turn transistor 42 on. If the voltage at node B is lower than $-V_C$, charge will flow from capacitor 38 to node B in a direction such as to equalize the voltages. After charge has flowed from node A to node B, transistors 42 and 40 are again switched by clock generator and control logic module 34 so that transistor 42 is off and transistor 40 is "on" thus recharging capacitor 38 to $-V_C$ voltage. In accordance with this invention, clock generator and control logic module 34 provides continuous switching of outputs $\phi 1$ and $\phi 2$ so that charge packets are continuously produced in capacitor 38 and transferred to node B.

Reference to FIG. 5 and especially to the representation of a voltage appearing at node B will clearly illustrate the two part analog-to-digital conversion cycle in accordance with this invention. The graphical representations of FIG. 5 illustrate approximately 1½ conversion cycles after steady-state operation has been achieved. Time $T_O$, therefore, is an arbitary time chosen to indicate the beginning of the two part cycle. Initially, transistor 24 is "off" as voltage $\phi 3$ is at zero volts. Slightly after $T_O$, $\phi 3$ changes to $-2V_G$ volts turning transistor 24 "on" and connecting node B to voltage source $-V_P$. The voltage at node B changes substantially instantaneously to $-V_P$ volts and reemains at this value so long as transistor 24 is "on" that is to say as long as $\phi 3$ remains negative. Although between time $T_0$ and $T_1$ transistor 42 is "on" and charge is transferred from node A to node B, the voltage at node B remains at $-V_P$ volts as long as $\phi 3$ remains negative. At time $T_1$, transistor switches 24 and 42 are turned "off" as voltages $\phi 3$ and $\phi 2$ change to zero volts. From time $T_1$ to $T_2$ no charge is transferred and the voltage at node B remains at $-V_P$ volts. At time $T_2$ transistor switch 24 remains "off" while transistor switch 42 turns "on" as voltage $\phi 2$ changes from zero to $-V_G$ volts. A charge packet is transferred from node A to node B while transistor 42 is "on" thus causing the voltage at node B to rise towards zero volts as indicated by the graphical representation of the voltage at node B. A similar transfer takes place at time $T_4$ and again at time $T_6$, charge being transferred at alternate times during the conduction of transistor switch 42. At time $T_6$ the voltage at node B increases to the threshold voltage of comparator 17 which provides a signal at output 50 thereof which is supplied both to counter 52 and to clock generator and control logic module 34. Upon receiving the output signal from comparator 17, clock generator and control logic module 34 inverts outputs $\phi 4$ and $\phi 5$ appearing at output terminals 56 and 58 of clock generator and control logic modules 34 thus turning transistor switch 46 "on" and switch 44 "off". The voltage at node C as indicated at FIG. 5 changes from zero volts or the lower of the differential voltages applied to input terminals 60 and 62 to the higher of two differential input voltages or to the input signal voltage, a change equal to the input signal voltage in either case. As the voltage at node C changes by an amount equal to $V_{in}$, the voltage at node B changes by a corresponding amount. It is emphasized that while the voltage at node C changes by an amount equal to the input signal voltage, the voltage at node B changes by an amount which may be nonlinearly related to the input signal voltage. Any nonlinearity is due to the effect of nonlinear capacitance in the charge storage location which is represented in FIG. 4 by capacitor 15. The change in voltage at node B as input switching transistors 44 and 46 select the high input signal is analogous to the change occurring at node B between the conditions of FIG. 1 and FIG. 2. It will be recalled that the voltage at node B during the conditions of FIG. 2 is indeterminate unless the precise characteristic of the nonlinear portion of the charge storage location is known. It is a feature of this invention, however, that the voltage at node B during this portion of the cycle need not be known as was hereinbefore described. At time $T_6$ clock generator and control logic module 34 supplies a start signal at output 66 thereof which starts counter 52. Clock generator and control logic module 34 further provides a clock signal at output 68 thereof to counter 52, the clock signal supplied at output 68 of clock generator and control logic modulator 34 is continuously supplied to counter 52 if desired. The counter being controlled by the appropriate start, stop and reset pulses supplied by module 34 and comparator 17. During the time period $T_6$ to $T_{20}$, charge packets are supplied by node B from capacitor 38 and the voltage increases in a step-wise fashion as illustrated at FIG. 5. It is emphasized that while the charge packets are of substantially equal size, the voltage need not increase in a linear fashion due to the effects of capacitior 15. At time $T_{20}$ node B again reaches the threshold voltage of comparator 17 which supplies an output pulse as indicated at FIG. 5 to counter 52 which halts the count and permits data to be read out from data output terminals 70. It will be understood that counter 52 may provide output data in any convenient form, that is to say serial data, parallel data or other convenient forms as might be required by one skilled in the art. At time $T_{20}$, the conversion cycle is complete and a new cycle starts. A reset pulse is supplied to counter 52 which resets the counter at zero. During the time between $T_{20}$ and $T_{24}$, the initial conditions for a conversion cycle are set and the counter is inhibited in any convenient manner. It will be appreciated that a number of methods may be appropriately utilized to control the operation of counter 52. For example, it may be desirable to provide a reset signal to counter 52 at the beginning of the measurement portion of the cycle rather than at the beginning of the initiation of the establishment of the initial conditions thereby eliminating the need to inhibit the count during the establishment of the initial conditions. Those skilled in the art will readily appreciate that within the true spirit and scope of this invention modifications might readily be made to the method of controlling the charge transfer portion of the analog-to-digital converter.

Between times $T_{20}$ and $T_{26}$, charge packets are supplied to node B after transistor switch 24 has allowed the voltage at node B to be decreased to $-V_P$ volts in the same manner as during the period from time $T_0$ to $T_5$. This preferred embodiment of the invention provides several advantages. It will be appreciated that the threshold of comparator 17 is approached from the same direction during the zero setting portion of the conversion cycle, that is to say the time when the initial conditions are set, as during the measurement portion of the cycle. This will eliminate any hysteresis effects in comparator 17. Further, charge is always applied to node B from the same charge source viz. capacitor 38, transistor switches 40 and 42 and voltage source $-V_C$.

Further, charge packets are supplied continuously subject only to the synchronous switching of transistor switch 42 so that any transient effects are eliminated. Still further, as was described in conjunction with FIGS. 1-3, node B is established at the threshold voltage of comparator 17 at both the beginning and the end of the measurement portion of the conversion cycle therefore the next change in the voltage across capacitor 15 is zero during the course of a measurement cycle. The effects of any nonlinearity in depletion capacitors 15 are therefore eliminated. Further, since comparator 17 is not required to determine any voltage absolutely but rather is required only to provide a signal when a preselected threshold voltage is reached, the constraints on comparator 17 and its associated threshold voltage 75 are that they maintain a constant threshold voltage during the course of a measurement cycle. It is further pointed out that long term stability is not needed so long as the threshold voltage is sufficient stable for the application contemplated during, for example, the period from time $T_6$ to $T_{20}$ of FIG. 5. Since reference voltage source 75 need not be any particular voltage, it may be somewhat more easily supplied than a reference voltage at a specific level as, for example, 10 volts or the like.

Figure 6:
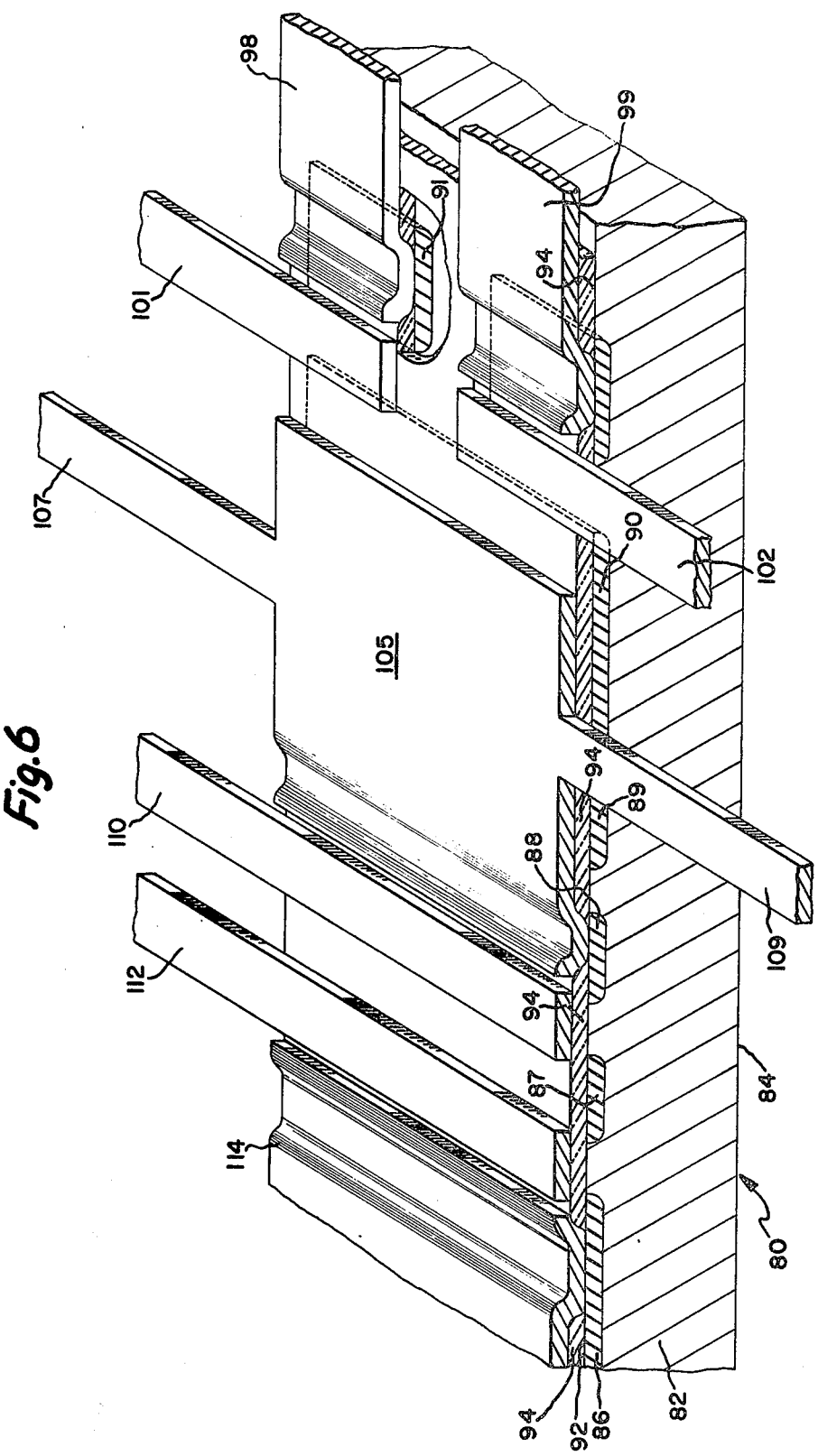
FIG. 6 is a cabinet projection of a semiconductor structure suitable for implementing an analog-to-digital converter in accordance with this invention.

FIG. 6 illustrates an exemplary embodiment of a structure in monolithic integrated circuit form for providing the circuit functions illustrated in the dotted line of FIG. 4. The integrated circuit, generally 80, of FIG. 6 includes a substrate 82 which in this embodiment is of n-conductivity type semiconductor material, as for example, silicon. Substrate 82 is conventionally provided with a contact (not illustrated) on lower surface 84 thereof which contact is the ground contact of the schematic of FIG. 4. It is to be understood that while this contact is illustrated as a ground contact, it may conveniently be a circuit ground and therefore at a potential other than zero volts if desired. Substrate 82 may have a resistivity of, for example, five ohm-centimeter. It will be appreciated that the method of fabrication of semiconductor 80 is conventional, the invention lying in the particular combination of components thereof. Semiconductor 80 is a p-channel MOS circuit and may readily be constructed in accordance with known techniques. Substrate 82 is provided with p-conductivity type regions 86, 87, 88, 89 and 90 extending from surface 92 thereof down into the bulk of the semiconductor material towards but not meeting opposite surface 84. P-conductivity type regions 86 through 90 may conveniently be formed by diffusion processes or any other process conventionally used to create such regions. Typically, p-type semiconductor regions may be on the order of one micron in depth. Insulating layer 94 selectively overlies surface 92 of substrate 82 as illustrated. Insulating layer 94 may conveniently comprise silicon dioxide formed, as is well known, by oxidation of the surface of substrate 82 or by deposition of silox and subsequent etch to remove the silicon dioxide from the undesired locations.

A plurality of metallizations is provided which constitute in combination with the p-conductivity type regions and the silicon dioxide insulating layer the various elements of the device. First and second metallizations 98 and 99 are the input terminals 60 and 62 (FIG. 4) of the device. Metallizations 98 and 99 may conveniently be formed of aluminum or other metal compatible with the processes utilized to manufacture the device. Electrodes 98 and 99 contact p-conductivity type regions 90 and 91 which regions form the drains of switching transistors 44 and 46. These and other metallizations may conveniently be formed by evaporation or similar techniques. Electrodes 101 and 102 insulatingly overlie substrate 82 and form the gate electrodes of transistors 44 and 46. P-type conductivity region 89 forms the common source of transistors 44 and 46 and also node C, and one plate of capacitor 14. Transistors 44 and 46 are substantially interchangeable in the monolithic semiconductor form illustrated, although care must be taken in order to insure that clock generator and control logic signals $\phi 4$ and $\phi 5$ are appropriately connected in order to insure that transistor 44 is connected to the lower of two differential input signals or to ground in a single-ended embodiment of this invention.

Electrode 105 comprises the top plate of capacitor 14, node B, and includes connections to comparator 17 and to semiconductor switch 24. Electrode 105 further ohmically contacts p-type semiconductor region 88 which forms the drain of semiconductor switch 42. Electrode 105 includes extensions 107 and 109 thereof which are adapted to be connected to further circuit elements which comprise comparator 17 and semiconductor switch 24. It is to be understood that semiconductor switch 24 would conventionally be constructed on the same semiconductor substrate with semiconductor device 80 and has been omitted herein for the purpose of more clearly illustrating the majority of the structure. Semiconductor switch 24 is of the same type as semiconductor switches 44, 46, 40 and 42. It is anticipated that a device of the type illustrated at 80 could be constructed either as a semiconductor device in and of itself or as part of a larger semiconductor device as, for example, a microprocessor, microcomputer or the like. It is an advantage of this invention that relatively little semiconductor area is required to implement an analog-to-digital converter in accordance herewith compared to prior art types. An integrated circuit of the type illustrated at 80 might readily be provided therefore on the same chip with an MOS microprocessor with little or no additional cost since the processing technologies are substantially identical.

P-type semiconductor region 88 comprises the drain of semiconductor switch 42 and also is the source of substantially all of depletion capacitance 15 which may be considered as existing between region 88 and substrate 82. Electrode 110 comprises the gate of semiconductor switch 42 and semiconductor region 87 the source thereof. Capacitor 38 is the capacitance between region 87 and the semiconductor substrate a depletion capacitance and the overlap capacitance between gates 112, 110 and the diffusion 87 an MOS capacitance. Region 87 further comprises the drain of semiconductor switch 40, electrode 112 comprising the gate thereof and semiconductor region 86 the source. Semiconductor region 86 is ohmically connected to electrode 114 which comprises contact 47 adapted to be connected to voltage source $-V_C$.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. In an analog-to-digital converter of the type wherein an analog signal is converted to a digital signal by the transfer of charge into and out of a charge storage location including a linear portion and a nonlinear portion, the improvement comprising:

means for at least partially isolating said linear and said nonlinear portions of said charge storage location; and means operatively associated with said charge storage location for maintaining the net change in charge stored in said nonlinear portion of said charge storage location at zero from the beginning to the end of the measurement cycle.

2. The analog-to-digital converter of claim 1 wherein said charge storage location comprises capacitor means, and further wherein said linear and nonlinear portions thereof are arranged in series circuit relationship including a common node therebetween.

3. The analog-to-digital converter of claim 2 further comprising means for connecting said analog signal to said linear portion of said capacitor means.

4. The analog-to-digital converter of claim 3 wherein said means associated with said charge storage location for maintaining the net change in charge stored in said nonlinear portion of said charge storage location from the beginning to the end of a measurement cycle comprises:

voltage sensitive means connected to said nonlinear portion of said charge storage location for providing an output signal when the voltage in said nonlinear portion of said charge storage location exceeds a preselected level; and means operatively connected to said voltage sensitive means for transferring charge to said common node until said output signal is received.

5. The analog-to-digital converter of claim 4 wherein said means for maintaining said net change in charge in said nonlinear portion of said charge storage location at zero further comprises:

means for initializing said voltage in said nonlinear portion at said preselected level, means for connecting said analog signal to said linear portion after said preselected voltage level has been reached, means for transferring charge to said common node until said preselected voltage is reached a second time, and means for measuring the amount of charge required to reach said preselected voltage said second time, said amount of charge being directly and linearly proportional to said analog signal.

6. The analog-to-digital converter of claim 5 wherein said means for transferring charge to said common node until said preselected voltage is reached said second time comprises:

means for transferring a plurality of substantially equal sized charge packets to said common node.

7. The analog-to-digital converter of claim 6 wherein said means for measuring said amount of charge required to reach said preselected voltage said second time comprises:

counter means connected to said means for transferring said plurality of substantially equal sized charged packets to said common node for counting the number of packets in said plurality.

8. The analog-to-digital converter of claim 7 wherein said means for initializing said voltage in said nonlinear portion at said preselected level comprises said means for transferring said plurality of charge packets.

9. A differential charge transfer analog-to-digital converter comprising:

a first charge storage location including first and second nodes, switch means connected to said second node for connecting said second node to a first input signal in a first position or to a second input signal in a second position;

detector means connected to said first node for producing an output signal in response to a preselected threshold signal level at said first node;

means responsive to said output signal connected to said first node for transferring charge into said first charge storage location when said switch means is in said first position until said preselected threshold signal level is reached and for continuing to transfer charge to said charge storage location when said switch means is in said second position until said preselected signal level is again reached; and means for measuring the amount of charge transferred when said switch is in said second position, the amount of charge being proportional to the difference in magnitude between said first and second input signals.

10. The analog-to-digital converter of claim 9 wherein said first charge storage location comprises a capacitive charge storage location.

11. The analog-to-digital converter of claim 10 wherein said means responsive to said output signal for transferring charge comprises means transferring a plurality of substantially equal size charge packets to said first node.

12. The analog-to-digital converter of claim 11 wherein said means for measuring the amount of charge transferred comprises means for counting the number of charge packets in said plurality.

13. An analog-to-digital converter comprising:

charge storage means characterized by linear and nonlinear portions thereof in series circuit relationship;

first and second differential input terminals adapted to be connected to an input signal source;

means for connecting said first input terminal to said linear portion of said charge storage location during a first portion of a measurement cycle and for connecting said second input terminal to said linear portion of said charge storage location during a second portion of a measurement cycle;

means responsive to the level of charge in said nonlinear portion of said charge storage location for providing an output signal responsive to a preselected level of charge in said nonlinear portion of said charge storage location;

means for transferring charge to said charge storage location during said first portion of said measurement cycle until said output signal is provided, thereby providing zeroing of the converter, and for transferring a measured amount of charge to said charge storage location during said second portion of said measurement cycle until said output signal is again provided, said measured amount of charge being proportional to the difference in voltage applied between said first and second input terminals.

14. In a method for converting an analog signal to a digital signal wherein charge is transferred into and out of a charge storage location including a linear portion, a series connected nonlinear portion and a common node therebetween comprising:

applying said signal to said charge storage location solely through said linear portion of said charge storage location; and transferring said charge to said charge storage location solely to said common node, maintaining the net change charge in said nonlinear portion at zero from the beginning to the end of a measurement cycle.

15. The method of claim 14 wherein transferring said charge to said charge storage location comprises transferring a plurality of substantially equal size charge packets to said charge storage location, and counting the number of charge packets transferred.

16. The method of claim 14 wherein maintaining said net change in charge at zero from the beginning to the end of a measurement cycle comprises:

initializing said level of charge in said nonlinear portion at a preselected level at the start of a measurement cycle, while connecting said linear portion to a zero or first level; and transferring charge into said common node while connecting said linear portion to the input signal, or to a second input signal level, until said preselected level is again reached the amount of charge required to re-establish said preselected level being linearly proportional to the difference between said zero or first level and said input signal or said second input signal level.

17. The method of claim 16 wherein said transferring comprises transferring a plurality of substantially equal charge packets and counting the number of packets required to re-establish said preselected level.

* * * * *